US 6,903,783 B2

(12) United States Patent
Yamamoto

(10) Patent No.: US 6,903,783 B2
(45) Date of Patent: Jun. 7, 2005

(54) TUNER FOR RECEIVING TELEVISION SIGNAL IN VHF BAND AND UHF BAND

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 511 days.

(21) Appl. No.: 09/996,294

(22) Filed: Nov. 28, 2001

(65) Prior Publication Data

US 2002/0063804 A1 May 30, 2002

(30) Foreign Application Priority Data

Nov. 29, 2000 (JP) ........................................ 2000-367753
Jan. 25, 2001 (JP) ........................................ 2001-017461
May 18, 2001 (JP) ........................................ 2001-148947

(51) Int. Cl.[7] ............................................. H04N 5/50
(52) U.S. Cl. ........................ 348/731; 348/732; 348/733
(58) Field of Search ................................ 348/731, 732, 348/733; 455/180.2, 188.2, 343.1; H04N 5/50

(56) References Cited

U.S. PATENT DOCUMENTS

| 4,499,602 | A | * | 2/1985 | Hermeling et al. ...... 455/180.3 |
| 4,580,288 | A | * | 4/1986 | Rinderle .................. 455/234.2 |
| 4,596,044 | A | * | 6/1986 | Aoki et al. ............... 455/189.1 |
| 6,392,715 | B1 | * | 5/2002 | Sato et al. ................... 348/731 |
| 6,665,022 | B1 | * | 12/2003 | Yamamoto et al. ......... 348/731 |

FOREIGN PATENT DOCUMENTS

| DE | 19819544 | 11/1999 |
| EP | 0457932 | 11/1991 |
| EP | 1047192 | 10/2000 |
| JP | 2001-156593 | 6/2001 |

* cited by examiner

Primary Examiner—John Miller
Assistant Examiner—Trang U. Tran
(74) Attorney, Agent, or Firm—Brinks Hofer Gilson & Lione

(57) ABSTRACT

In a television tuner, a predetermined bias voltage is applied to the anode of a first switching diode. A power supply voltage is applied to the collector of a switching transistor via a power supply resistor, and the emitter of the switching transistor is grounded. The collector of the switching transistor is connected to an input terminal of a first FET via a first resistor. The first switching diode and the switching transistor are both switched on or off correspondingly to whether a television signal in the UHF band is to be received or a television signal in the VHF band is to be received.

22 Claims, 5 Drawing Sheets

TUNER FOR RECEIVING TELEVISION SIGNAL IN VHF BAND AND UHF BAND

BACKGROUND OF THE INVENTION

1. Field of the Invention

The present invention relates to a television tuner for receiving a television signal in the UHF band or the VHF band.

2. Description of the Related Art

FIG. 5 shows the configuration of a conventional television tuner. An input terminal 31, to which a television signal in the VHF band or the UHF band is input, is coupled to a VHF tuning circuit 41 of a VHF tuner unit 40. In the subsequent stage of the VHF tuning circuit 41, a first FET (dual-gate FET) 42 which functions as a high-frequency amplifier is provided.

The input terminal 31 is also coupled to a UHF tuning circuit 51 of a UHF tuner unit 50 via a first switching diode 33. In the subsequent stage of the UHF tuning circuit 51, a second FET 52 which functions as a high-frequency amplifier is provided.

The VHF tuner unit 41 includes an inductor 41b, one end thereof being grounded for high frequencies via a DC cutting capacitor 41a; three inductors 41c, 41d, and 41e, sequentially connected in series to the other end of the inductor 41b for high frequencies; a first varactor diode 41f, the cathode thereof being connected to the inductor 41e on the hot-side end and the anode thereof being grounded, thus being connected in parallel to the four inductors 41b, 41c, 41d, and 41e; and a second switching diode 41g connected in parallel to the middle inductors 41c and 41d for high frequencies.

The node between the two middle inductors 41c and 41d is coupled to a filter 32. The anode of the second switching diode 41g is connected to the anode of the first switching diode 33 for DC voltage.

To the node between the DC cutting capacitor 41a and the inductor 41b, a predetermined bias voltage which is obtained by dividing a power supply voltage B by resistors is applied. The bias voltage is applied to each of the anodes of the first and second switching diodes 33 and 41g via the inductors 41b, 41c, etc.

The cathode of the second switching diode 41g is connected to a first switching terminal 34a of a band switching circuit 34 via a resistor 41h.

The node between the inductor 41e on the hot-side end and the cathode of the varactor diode 41f is coupled to a first gate of the FET 42, which functions as an input terminal of the FET 42. The first gate is connected to the collector of the switching transistor 35. A power supply voltage B is applied to the collector of the switching transistor 35 via a power supply resistor 36, and the emitter of the switching transistor 35 is grounded.

The cathode of the first switching diode 33 is connected to the collector of the switching transistor 35 via a resistor 37.

Furthermore, the cathode of the first switching diode 33 is coupled to the node of the inductors 51a and 51b constituting the UHF tuning circuit 51 of the UHF tuner unit 50. A varactor diode 51c is connected in parallel to the two inductors 51a and 51b. The UHF tuning circuit 51 is coupled to a first gate of the second FET 52, which functions as an input terminal of the second FET 52.

To the first gate of the second FET 52, one end of a peaking coil 52a is connected. The other end of the peaking coil 52a is grounded for high frequencies, connected to the base of the switching transistor 35, and connected to a second switching terminal 34b of the band switching circuit 34.

Although not shown, tuning voltages for changing the tuning frequencies of the tuning circuits 41 and 51 are applied to the cathodes of the first and second varactor diodes 41f and 51c, and AGC voltages for controlling gains are applied to second gates of the first and the second FETs 42 and 52, respectively.

Furthermore, a mixer, etc. for frequency conversion is provided in the subsequent stage of each of the FETs 42 and 52, although not shown and description thereof omitted.

The band switching circuit 34 generates switching voltages for switching the operation status of the VHF tuner unit 40 and the UHF tuner unit 50 and for switching the reception band of the VHF tuner unit 40. More specifically, the voltage applied to the first switching terminal 34a goes to high level (e.g., the power supply voltage B) when a television signal in the VHF low band or a television signal in the UHF band is to be received, and the voltage goes to low level (e.g., 0 volts) when a television signal in the VHF high band is received. The voltage applied to the second switching terminal 34b goes to high level only when a television signal in the UHF band is to be received, and the voltage goes to low level when a television signal in the VHF band (both the low band and the high band) is to be received.

In the configuration described above, when a television signal in the VHF band is to be received, the second switching terminal 34b goes to low level, deactivating the second FET 52. Thus, the switching transistor 35 is turned off, whereby a bias voltage is applied to the first gate of the first FET 42 via the power supply resistor 36. The bias voltage is appropriately arranged to be on the order of 1.7 volts by the internal circuit of the first FET 42. Furthermore, the first switching circuit 33 is turned off, so that the television signal is inhibited from entering the UHF tuning circuit 51.

When a television signal in the VHF low band is to be received, the first switching terminal 34a goes to high level, turning off the second switching diode 41g, whereby the VHF tuning circuit 41 tunes to the low band.

When a television signal in the VHF high band is to be received, the first switching terminal 34a goes to low level, turning on the second switching diode 41g. Thus, the inductors 41c and 41d become effectively absent in the VHF tuning circuit 41, whereby the VHF tuning circuit 41 tunes to the high band.

When a television signal in the UHF band is to be received, the second switching terminal 34b goes to high level, whereby a bias voltage is applied to the first gate of the second FET 52, activating the second FET 52. Furthermore, the switching transistor 35 is turned on, whereby the voltage applied to the first gate of the first FET 42 becomes substantially 0 volts, deactivating the first FET 42. Furthermore, the first switching diode 33 is turned on in response to the switching transistor 35 being tuned on, so that the television signal in the UHF band is input to the UHF tuning circuit 51 of the UHF tuner unit 50.

In the above configuration, the output capacitance (the internal capacitance between the collector and the emitter) of the switching transistor 35 is applied to the first gate of the first FET 42 when the switching transistor 35 is turned off and the first FET 42 is activated. As a result, the tuning frequency range of the VHF tuning circuit 41 becomes narrower, and in particular, tuning to the high hand becomes difficult, causing deterioration of NF.

Furthermore, when the switching transistor 35 is turned off, the first switching diode 33 is also tuned off; thus, the bias voltage applied to the anode of the first switching diode 33 must be lower than 1.7 volts (the bias voltage applied to the first gate of the first FET 42). If the voltage is arranged, for example, to be on the order of 1.0 volt, the reverse voltage between the anode and the cathode of the first switching diode 33 is lowered, the first switching diode 33 thus causing a distortion when a television signal of a large magnitude is input.

A countermeasure against the above problem would be to lower the bias voltage applied to the first switching diode 33. However, in accordance with the approach, the resistance of the resistor 41h on the cathode side must be small in order that a sufficient current flow through the second switching diode 41g when a high band signal is to be received. The resistor 41h, which is connected in parallel to the inductor 41b, lowers the Q of the VHF tuning circuit 41 and increases insertion loss, deteriorating NF in the high band.

SUMMARY OF THE INVENTION

Accordingly, it is an object of the present invention to provide a television tuner in which the internal capacitance of a switching transistor for switching the bias voltage for a first gate of an FET for amplifying a television signal in the VHF band is prevented from being coupled to a VHF tuning circuit so that the tuning frequency range of the VHF tuning circuit is increased.

To this end, the present invention provides a television tuner including an input terminal to which a television signal in the VHF band or the UHF band is input; a VHF tuner unit including a VHF tuning circuit coupled to the input terminal, and a first FET for at least amplifying a television signal in the VHF band, provided in the subsequent stage of the VHF tuning circuit; a switching transistor for switching a bias voltage on an input terminal of the first FET; and a UHF tuner unit for receiving a television signal in the UHF band, coupled to the input terminal via a first switching diode. In the television tuner, a predetermined voltage is applied to the anode of the first switching diode, a power supply voltage is applied to the collector of the switching transistor via a power supply resistor and the emitter of the switching transistor is grounded, the collector of the switching transistor is connected to the input terminal of the first FET via a first resistor, and the first switching diode and the switching transistor are both switched on or off correspondingly to whether the television signal in the UHF band is to be received or the television signal in the VHF band is to be received.

Thus, the internal capacitance of the switching transistor being turned off is prevented from being coupled to the input terminal of the first FET and the VHF tuning circuit via the first resistor, increasing the variable tuning frequency range. Accordingly, NF is improved particularly when a television signal in the VHF high band is received. Furthermore, because the collector voltage of the switching transistor being turned off becomes higher, the reverse voltage for the first switching diode being turned off becomes larger accordingly, reducing distortion due to the first switching diode when a television signal of a large magnitude is input. Furthermore, the bias voltage applied to the anode of the first switching diode can be increased.

The arrangement may be such that the VHF tuning circuit includes a second switching diode, the VHF tuning circuit tuning to a high band or a low band of the VHF band correspondingly to on or off of the second switching diode, the cathode of the first switching diode is connected to the collector of the switching transistor via a second resistor, the predetermined voltage is applied to the anode of the second switching diode, and a first high-level or low-level switching voltage is applied to the cathode of the second switching diode via a third resistor correspondingly to whether a television signal in the low band is to be received or a television signal in the high band is to be received.

Thus, even if the resistance of the third resistor is high, a sufficient current is allowed to flow through the second switching diode. In addition, the Q of the VHF tuning circuit can be improved, achieving excellent selectivity characteristics. Furthermore, loss in the VHF tuning circuit can be reduced.

The arrangement may also be such that the UHF tuner unit includes a second FET for amplifying the television signal in the UHF band, a peaking coil which tunes to a low band of the UHF band is provided between an input terminal of the second FET and the ground, a high-level or low-level second switching voltage is applied to the input terminal of the second FET via the peaking coil correspondingly to whether a television signal in the UHF band to be received or a television signal in the VHF band is to be received, and the second switching voltage is applied to the base of the switching transistor.

This allows the switching of the operation status of the first FET in association with the switching of the operation status of the second FET.

Furthermore, the arrangement may be such that the cathode of the second switching diode and the collector of the switching transistor are connected via a parallel circuit of a fourth resistor and a DC cutting capacitor.

Thus, the second switching diode provided in the VHF tuning circuit is turned on when a television signal in the UHF band is to be received, the diode not causing a distortion. In addition, inductors in the VHF tuning circuit and a coupling capacitor forms a high-pass filter, inhibiting input of unwanted television signal in the VHF band.

The arrangement may also be such that a third switching diode is provided between the cathode of the second switching diode and the collector of the switching transistor, the anode thereof being connected to the cathode of the second switching diode and the cathode thereof being connected to the collector of the switching transistor, and the collector of the switching transistor is grounded via a DC cutting capacitor.

Thus, a television signal input to the VHF tuning circuit is sufficiently shunt. In addition, a high-pass filter, which is constituted of a coupling capacitor connected between the first switching diode and the UHF tuning circuit and the inductors in the VHF tuning circuit, exhibits stable characteristics irrespective of variation in the saturated resistance of the switching transistor being turned on.

DESCRIPTION OF THE PREFERRED EMBODIMENT

Figure 1:
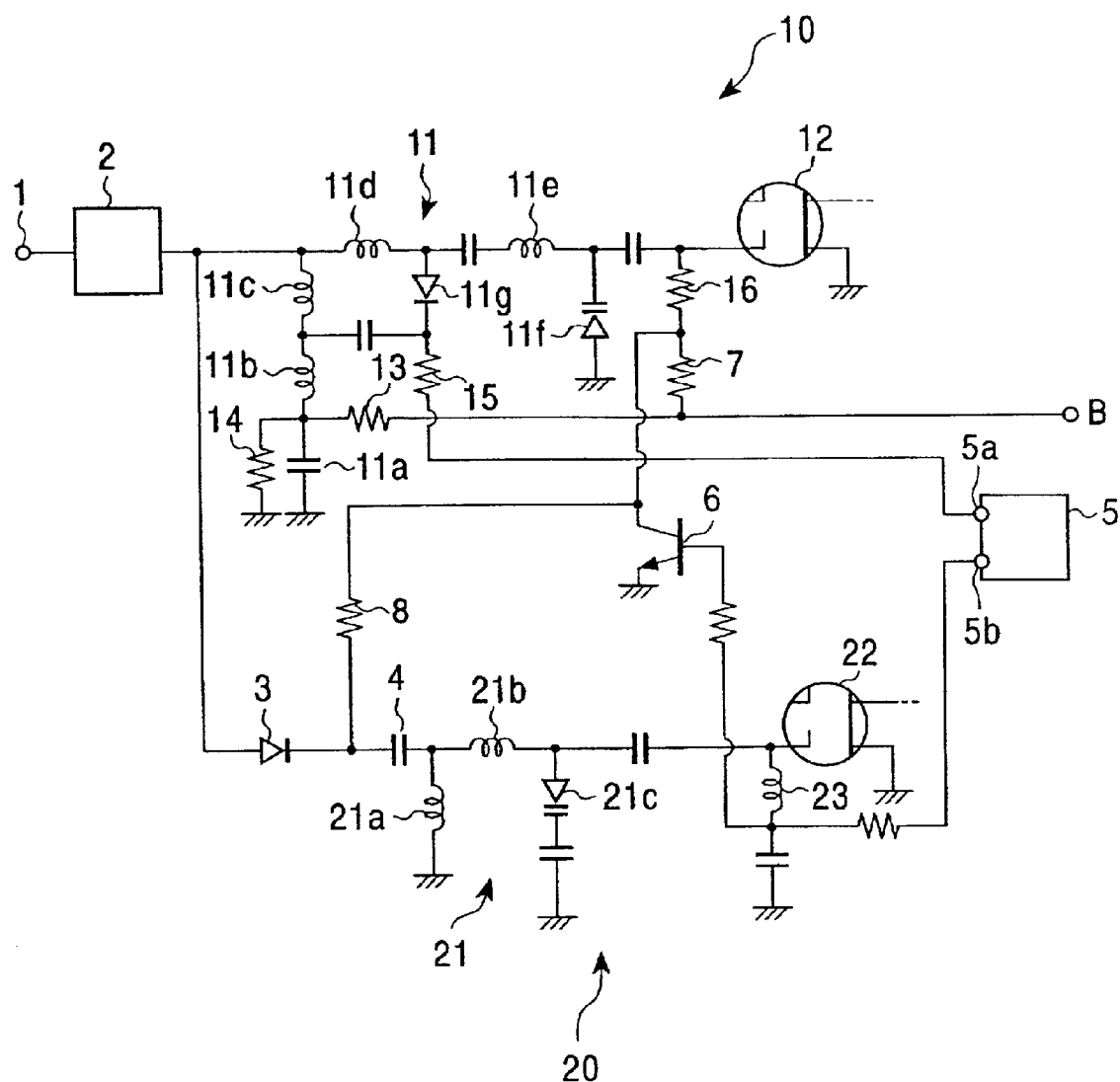
FIG. 1 is a circuit diagram of a television tuner according to an embodiment of the present invention.

FIG. 1 is a circuit diagram showing the configuration of a television tuner according to an embodiment of the present invention. An input terminal 1, to which a television signal in the VHF band or the UHF band is input, is coupled to a VHF tuning circuit 11 of a VHF tuner unit 10, via a filter 2 for suppressing unwanted signals. In the subsequent stage of the VHF tuning circuit 11, a first FET (dual-gate FET) 12 which functions as a high-frequency amplifier is provided.

The input terminal 1 is also coupled to a UHF tuning circuit 21 of a UFH tuner unit 20 via the filter 2, a first switching diode 3, and a coupling capacitor 4 in series. In the subsequent stage of the UHF tuning circuit 21, a second FET 22 which functions as a high-frequency amplifier is provided.

The VHF tuning circuit 11 includes an inductor 11b, one end thereof being grounded for high frequencies via a DC cutting capacitor 11a; three inductors 11c, 11d, and 11e sequentially connected in series to the other end of the inductor 11b for high frequencies; a first varactor diode 11f, the cathode thereof being connected to the inductor 11e on the hot-side end and the anode thereof being grounded, thus being connected in parallel to the four inductors 11b, 11c, 11d, and 11e; and a second switching diode 11g connected in parallel to the two middle inductors 11c and 11d for high frequencies.

The node between the two middle inductors 11c and 11d is coupled to the filter 2. The anode of the second switching diode 11g is connected to the anode of the first switching diode 3 via the inductor 11d for DC voltage.

To the node between the DC cutting capacitor 11a and the inductor 11b, a predetermined bias voltage which is obtained by dividing a power supply voltage B by bias voltage setting resistors 13 and 14 is applied. The bias voltage is applied to each of the anodes of the first switching diode 3 and the second switching diode 11g via the inductors 11b, 11c, etc.

The cathode of the second switching diode 11g is connected to a first switching terminal 5a of a band switching circuit 5 via a third resistor 15.

The node between the inductor 11e on the hot-side end and the cathode of the first varactor diode 11f is coupled to a first gate of the FET 12, which serves as an input terminal of the FET 12. The first gate is connected to the collector of a switching transistor 6 via a first resistor 16. The power supply voltage B is applied to the collector of the switching transistor 6 via a power supply resistor 7, and the emitter of the switching transistor 6 is grounded.

The cathode of the first switching diode 3 is connected to the collector of the switching transistor 6 via a second resistor 8, and coupled via the coupling capacitor 4 to the node between two inductors 21a and 21b constituting the UHF tuning circuit 21. A varactor diode 21c is connected in parallel to the two inductors 21a and 21b, the anode thereof being grounded for DC voltage via the two inductors 21a and 21b. The UHF tuning circuit 21 is coupled to a first gate of the FET 22, which serves as an input terminal of the second FET 22.

The first gate of the second FET 22 is connected to one end of a peaking coil 23. The other end of the peaking coil 23 is grounded for high frequencies, connected to the base of the switching transistor 6 for DC voltage, and connected to a second switching terminal 5b of the band switching circuit 5.

Although not shown, to the cathodes of the first and second varactor diodes 11f and 21c, tuning voltages for changing the tuning frequencies of the tuning circuits 11 and 21 are applied, respectively, and AGC voltages for controlling gains are applied to second gates of the first and second FETs 12 and 22, respectively.

Furthermore, in the subsequent stage of each of the FETs 12 and 22, a mixer, etc. for conversion of frequencies is provided, although not shown and description thereof omitted.

The band switching circuit 5 generates switching voltages for switching the operation status of the VHF tuner unit 10 and the UHF tuner unit 20 and for switching the reception band of the VHF tuner unit 10. More specifically, the voltage applied to the first switching terminal 5a goes high level (e.g., the power supply voltage) when a television signal in the VHF low band or the UHF band is to be received, and the voltage goes to low level (e.g., 0 volts) when a television signal in the VHF high band is to be received. Furthermore, the voltage applied to the second switching terminal 5b goes to high level only when a television signal in the UHF band is to be received, and the voltage goes to low level when a television signal in the VHF band (both the low band and the high band) is to be received.

In the configuration described above, when a television signal in the VHF band is to be received, the second switching terminal 5b goes to low level, deactivating the second FET 22. Thus, the switching transistor 6 is turned off, whereby a bias voltage is applied to the first gate of the first FET 12 via the power supply resistor 7 and the first resistor 16. The bias voltage is appropriately arranged to be on the order of 1.7 volts by the internal circuit of the first FET 12. The collector voltage of the switching transistor 6 becomes higher than 1.7 volts, the specific voltage being determined according to the resistance ratio between the first resistor 16 and the power supply resistor 7. Furthermore, the first switching diode 3 is turned off, inhibiting the television signal from entering the UHF tuning circuit 21. The bias voltage applied to the anode of the switching diode 3 (the voltage applied at the node between the resistors 13 and 14) can be set higher in accordance with the higher collector voltage of the switching transistor 6.

When a television signal in the VHF low band is to be received, the first switching terminal 5a goes to high level, turning off the second switching diode 11g, whereby the VHF tuning circuit 11 tunes to the low band.

When a television signal in the VHF high band is to be received, the first switching terminal 5a goes to low level, turning on the second switching diode 11g. Thus, the two inductors 11c and 11d is effectively absent in the VHF tuning circuit 11, whereby the VHF tuning circuit 11 tunes to the high band. The bias voltage applied to each of the anodes of the first switching diode 3 and the second switching diode 11g can be set higher by the reason described above. Thus, even if the resistance of the third resistor 15 is high, the second switching diode 11g can be turned on so that a sufficient current flows therethrough. Accordingly, the Q of the VHF tuning circuit 11 in relation to a television signal in the high band being received can be improved.

When a television signal in the UHF band is to be received, the second switching terminal 5b goes to low level, whereby a bias voltage is applied to the first gate of the second FET 22, activating the second FET 22. Furthermore, the switching transistor 6 is turned on, whereby the voltage on the first gate of the first FET 12 becomes substantially 0 volts, deactivating the first FET 12. Furthermore, the first switching diode 3 is turned on in response to the switching transistor 6 being turned on, so that the television signal in the UHF band is input to the UHF tuning circuit 21 of the UHF tuner unit 20 via the coupling capacitor 4.

At this time, the first switching terminal 5a also goes to high level, turning off the second switching diode 11g, whereby the VHF tuning circuit 11 tunes to the low band. However, because the first FET 12 is deactivated, no television signal is output to the output side of the first FET 12.

Figure 2:
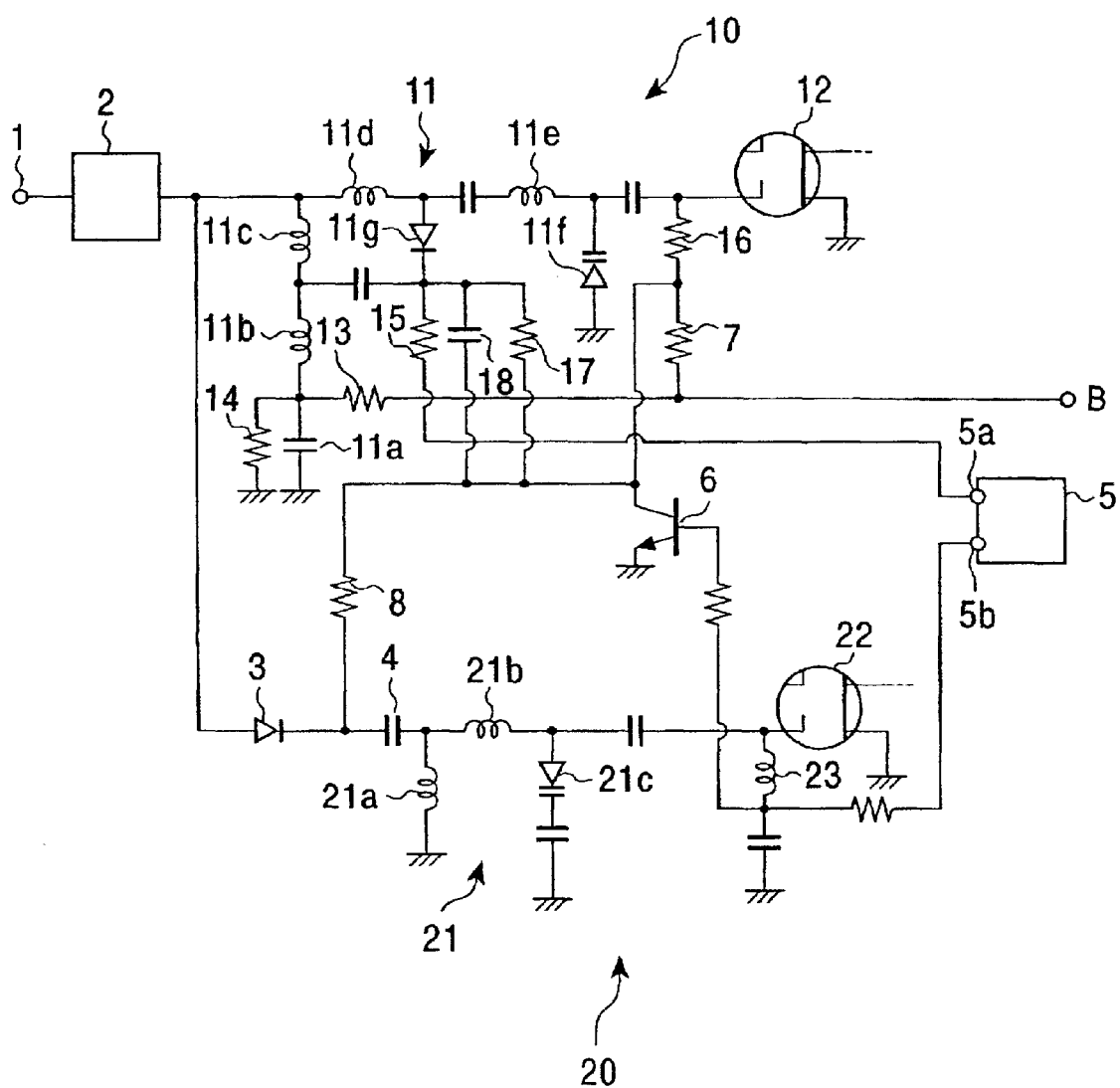
FIG. 2 is a circuit diagram of a television tuner according to a modification of the embodiment.

As shown in FIG. 2, if the cathode of the second switching diode 11g and the collector of the switching transistor 6 are connected for DC voltage via a fourth resistor 17 and also short-circuited for high frequencies via a DC cutting capacitor 18, the second switching diode 11g is turned on when a television signal in the UHF band is to be received. Thus, even if the television signal is input to the VHF tuning circuit 11, the second switching diode 11g does not cause a distortion. Furthermore, because the television signal is not applied to the first varactor diode 11f, the varactor diode 11f does not cause a distortion either.

Figure 3:
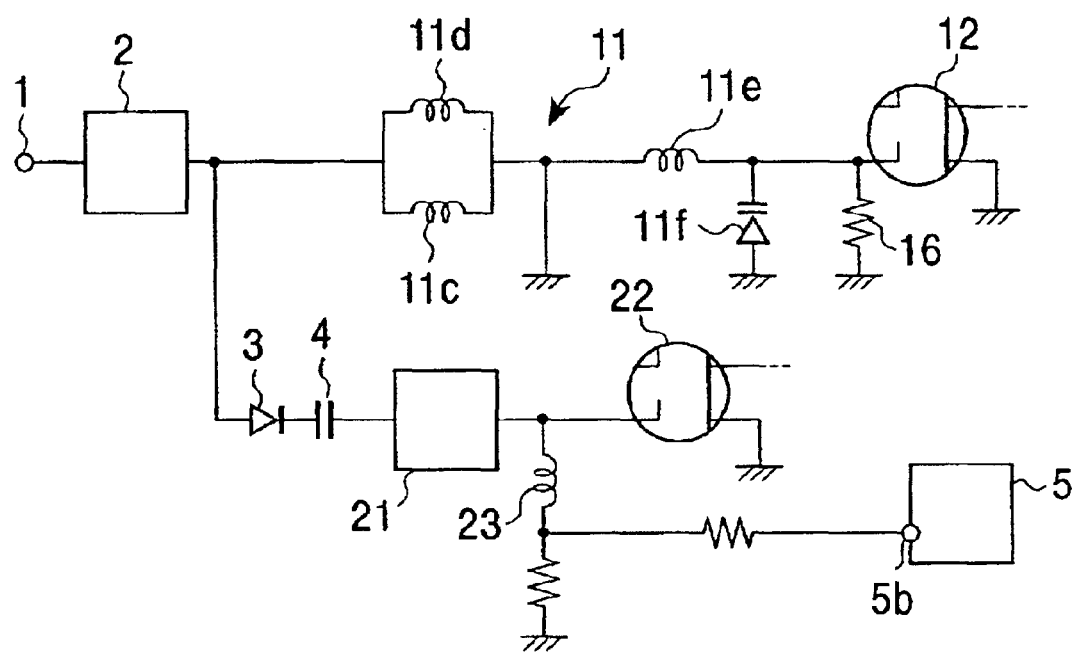
FIG. 3 is a circuit diagram of a television tuner according to another modification of the embodiment.

FIG. 3 shows an equivalent circuit of the example above, in which the two inductors 11c and 11d in the VHF tuning circuit 11 are connected in parallel with each other via the second switching diode 11g, and one end of each of the inductors 11c and 11d is grounded for high frequencies, the inductors 11c and 11d and the coupling capacitor 4 forming a high-pass filter. Thus, unwanted television signals in the VHF band can be inhibited from entering the UHF tuning circuit 21 by appropriately setting the cutoff frequency of the high-pass filter.

Figure 4:
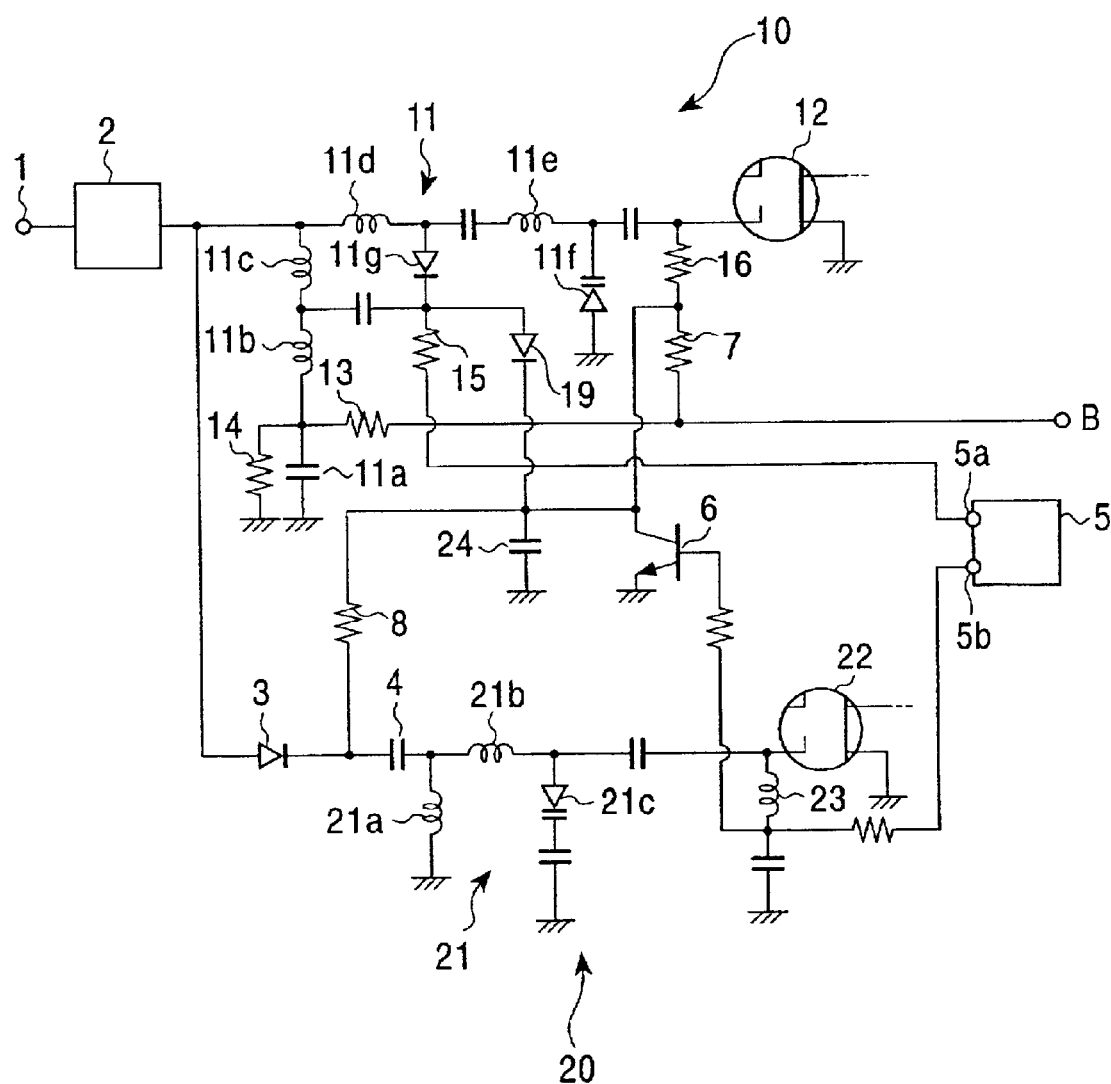
FIG. 4 is a circuit diagram of a television tuner according to yet another modification of the embodiment.
Figure 5:
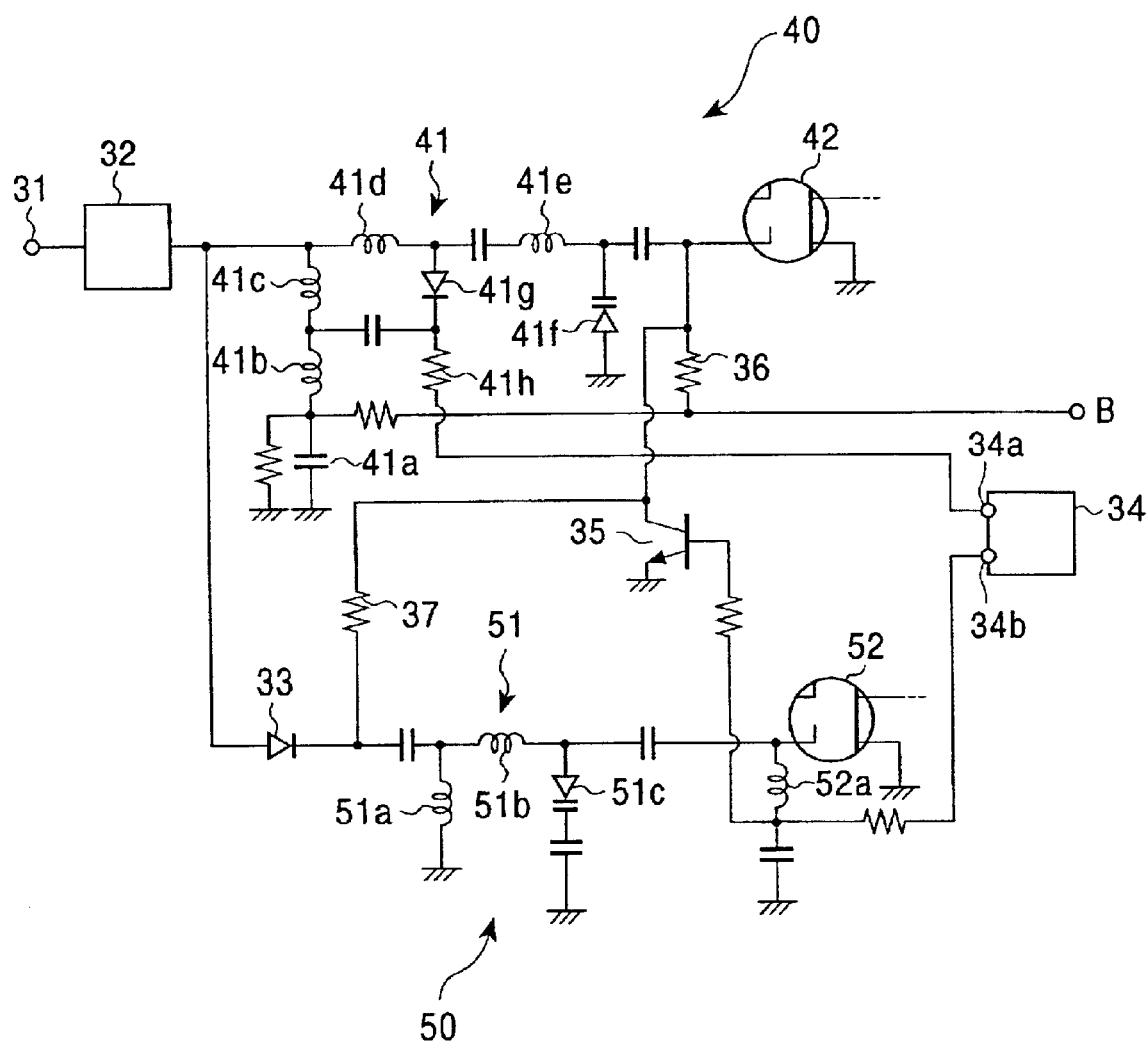
FIG. 5 is a circuit diagram of a conventional television tuner.

Furthermore, as shown in FIG. 4, the arrangement may be such that the cathode of the second switching diode 11g and the collector of the switching transistor 6 are connected via a third switching diode 19, and the collector of the switching transistor 6 is grounded via a DC cutting capacitor 24. This example can also be represented by the equivalent circuit shown in FIG. 3. In this example, even if the saturated resistance varies for the switching transistor when it is turned on, the saturated resistance can be disregarded due to a DC cutting capacitor 24. In addition, the forward voltage is small for the third switching diode 19 when it is turned on and the current which flows through the second switching diode 11g increases, sufficiently shunting a television signal input to the VHF tuning circuit 11. Furthermore, a high-pass filter, which is constituted of the coupling capacitor 4 connected between the first switching diode 3 and the UHF tuning circuit 21 and the inductors 11c and 11d in the VHF tuning circuit 11, exhibits stable characteristics irrespective of variation in the saturated resistance of the switching transistor 6.

What is claimed is:

1. A television tuner comprising:
    an input terminal configured to receive a television signal in a VHF band or a UHF band;
    a VHF tuner unit comprising a VHF tuning circuit coupled to said input terminal, and a first field-effect transistor (FET) configured to at least amplify a television signal in the VHF band;
    a switching transistor configured to switch a bias voltage applied to an input terminal of said first FET; and
    a UHF tuner unit configured to receive a television signal in the UHF band and coupled to said input terminal via a first switching diode;
    wherein a predetermined voltage is applied to an anode of said first switching diode, a power supply voltage is applied to a collector of said switching transistor via a power supply resistor and an emitter of said switching transistor is grounded, the collector of said switching transistor is connected to the input terminal of said first FET via a first resistor, and said first switching diode and said switching transistor are both switched on or off depending on whether the television signal in the UHF band is to be received or the television signal in the VHF band is to be received, respectively.

2. A television tuner according to claim 1, wherein said VHF tuning circuit comprises a second switching diode, said VHF tuning circuit tuning to a high band or a low band of the VHF band dependent on whether said second switching diode is on or off, respectively, a cathode of said first switching diode is connected to the collector of said switching transistor via a second resistor, said predetermined voltage is applied to an anode of said second switching diode, and a first high-level or low-level switching voltage is applied to a cathode of said second switching diode via a third resistor dependent on whether a television signal in said low band is to be received or a television signal in said high band is to be received, respectively.

3. A television tuner according to claim 1, wherein said UHF tuner unit comprises a second FET configured to amplify the television signal in the UHF band, a peaking coil which tunes to a low band of the UHF band is provided between an input terminal of said second FET and the ground, a high-level or low-level second switching voltage is applied to an input terminal of said second FET via said peaking coil dependent on whether a television signal in the UHF band is to be received or a television signal in the VHF band is to be received, respectively, and said second switching voltage is applied to a base of said switching transistor.

4. A television tuner according to claim 2, wherein the cathode of said second switching diode and the collector of said switching transistor are connected via a parallel circuit of a fourth resistor and a capacitor.

5. A television tuner according to claim 2, wherein a third switching diode is provided between the cathode of said second switching diode and the collector of said switching transistor, an anode of the third switching diode being connected to the cathode of said second switching diode and a cathode of the third switching diode being connected to the collector of said switching transistor, and the collector of said switching transistor is grounded via a capacitor.

6. A television tuner according to claim 2, wherein said UHF tuner unit comprises a second FET configured to amplify the television signal in the UHF band, a peaking coil which tunes to a low band of the UHF band is provided between an input terminal of said second FET and the ground, a high-level or low-level second switching voltage is applied to an input terminal of said second FET via said peaking coil dependent on whether a television signal in the UHF band is to be received or a television signal in the VHF band is to be received, respectively, and said second switching voltage is applied to a base of said switching transistor.

7. A television tuner according to claim 4, wherein said UHF tuner unit comprises a second FET configured to amplify the television signal in the UHF band, a peaking coil which tunes to a low band of the UHF band is provided between an input terminal of said second FET and the ground, a high-level or low-level second switching voltage is applied to an input terminal of said second FET via said peaking coil dependent on whether a television signal in the UHF band is to be received or a television signal in the VHF band is to be received, respectively, and said second switching voltage is applied to a base of said switching transistor.

8. A television tuner according to claim 5, wherein said UHF tuner unit comprises a second FET configured to amplify the television signal in the UHF band, a peaking coil which tunes to a low band of the UHF band is provided between an input terminal of said second FET and the ground, a high-level or low-level second switching voltage is applied to an input terminal of said second FET via said peaking coil dependent on whether a television signal in the UHF band is to be received or a television signal in the VHF band is to be received, respectively, and said second switching voltage is applied to a base of said switching transistor.

9. A television tuner comprising:
an input terminal configured to receive a television signal in a VHF band or a UHF band;
a VHF tuner unit having a VHF tuning circuit coupled to the input terminal and a first amplification circuit configured to amplify a television signal in the VHF band;
a first switch having a terminal connected with an input terminal of the first amplification circuit through a first resistor, the first switch controlling a voltage applied to the input terminal of the first amplification circuit;
a second resistor connected with the terminal of the first switch, a voltage applied to the terminal of the first switch through the second resistor; and
a UHF tuner unit configured to receive a television signal in the UHF band and coupled to the input terminal via a second switch;
wherein the first and second switch are both switched on when the television signal in the UHF band is received and are both switched off when the television signal in the VHF band is received.

10. A television tuner according to claim 9, wherein the first switch grounds the input terminal of the first amplification circuit when on and permits a voltage other than ground to be applied to the input terminal of the first amplification circuit when off.

11. A television tuner according to claim 9, wherein the VHF tuning circuit comprises a third switch that controls tuning of the VHF tuning circuit to a high band or a low band of the VHF band dependent on whether the third switch is on or off, respectively, and the second switch is connected to the terminal of the first switch through a third resistor.

12. A television tuner according to claim 11, further comprising a parallel combination of a fourth resistor and a capacitor connecting the terminal of the first switch and the third switch.

13. A television tuner according to claim 11, further comprising a fourth switch disposed between the terminal of the first switch and the third switch, the fourth switch being switched on when the first switch is switched on and being switched off when the first switch is off.

14. A television tuner according to claim 13, further comprising a capacitor disposed between the fourth switch and ground.

15. A television tuner according to claim 13, wherein the terminal of the first switch is a collector of a transistor and the second, third, and fourth switches are diodes.

16. A television tuner according to claim 9, further comprising a band switching circuit that controls whether an output of the combination of the VHF tuner unit and the UHF tuner unit is supplied by the VHF tuner unit or the UHF tuner unit.

17. A television tuner according to claim 11, further comprising a band switching circuit having outputs connected with a second terminal of the first switch and connected with the third switch, wherein the band switching circuit controls whether an output of the combination of the VHF tuner unit and the UHF tuner unit is supplied by the VHF tuner unit or the UHF tuner unit.

18. A television tuner according to claim 11, wherein the UHF tuner unit comprises a second amplification circuit configured to amplify the television signal in the UHF band, an inductor is disposed between an input terminal of the second amplification circuit and the ground and which tunes to a low band of the UHF band, a high-level or low-level switching voltage is applied to an input terminal of the second amplification circuit via the inductor dependent on whether the television signal in the UHF band is to be received or the television signal in the VHF band is to be received, respectively, and the second switching voltage is applied to an input terminal of the first switch.

19. A television tuner comprising:
a VHF tuner unit to receive a television signal in a VHF band, the VHF tuner unit having a VHF tuning circuit coupled to the input terminal and an amplification circuit to amplify the television signal in the VHF band;
a UHF tuner unit to receive a television signal in a UHF band, the UHF tuner unit connected in parallel with the VHF tuner unit such that a television signal input to the combination of the VHF tuner unit and UHF tuner unit is output from only one of the combination of the VHF tuner unit and UHF tuner unit; and
a first switch connected with the amplification circuit through a resistor and controlling a voltage applied to the amplification circuit, wherein a capacitance of the first switch is decoupled from the VHF tuning circuit.

20. A television tuner according to claim 19, wherein the VHF tuning circuit comprises a second switch that controls tuning of the VHF tuning circuit to a high band or a low band of the VHF band dependent on whether the second switch is on or off, respectively.

21. A television tuner according to claim 20, further comprising a parallel combination of a second resistor and a capacitor connecting the first and second switch.

22. A television tuner according to claim 20, further comprising a third switch disposed between the first and second switch, the third switch being switched on when the first switch is switched on and being switched off when the first switch is off.

* * * * *